(12) United States Patent
Zhang

(10) Patent No.: US 11,380,737 B2
(45) Date of Patent: Jul. 5, 2022

(54) ORGANIC LIGHT-EMITTING DIODE PIXEL STRUCTURE AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Xingyong Zhang, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 340 days.

(21) Appl. No.: 16/488,438

(22) PCT Filed: Apr. 16, 2019

(86) PCT No.: PCT/CN2019/082840
§ 371 (c)(1),
(2) Date: Aug. 23, 2019

(87) PCT Pub. No.: WO2020/155405
PCT Pub. Date: Aug. 6, 2020

(65) Prior Publication Data
US 2021/0335911 A1    Oct. 28, 2021

(30) Foreign Application Priority Data
Feb. 1, 2019 (CN) .......................... 201910104792.X

(51) Int. Cl.
*H01L 27/32* (2006.01)

(52) U.S. Cl.
CPC ...... *H01L 27/3218* (2013.01); *H01L 27/3216* (2013.01)

(58) Field of Classification Search
CPC ............. H01L 27/3216; H01L 27/3218; H01L 27/3211; H01L 27/326; G02F 2201/52
See application file for complete search history.

(56) References Cited

U.S. PATENT DOCUMENTS

| | | | |
|---|---|---|---|
| 2015/0009104 A1* | 1/2015 | Kim | ...................... G09G 3/3225 345/76 |
| 2015/0091785 A1 | 4/2015 | Lee | |
| 2016/0240592 A1* | 8/2016 | Li | ........................ H01L 27/3216 |
| 2016/0351116 A1 | 12/2016 | Sun | |

FOREIGN PATENT DOCUMENTS

| | | | | |
|---|---|---|---|---|
| CN | 104466007 A | | 3/2015 | |
| CN | 104716125 | * | 6/2015 | .............. H01I 21/66 |
| CN | 106449723 A | | 2/2017 | |
| CN | 108321179 A | | 7/2018 | |
| CN | 108962944 A | | 12/2018 | |

* cited by examiner

*Primary Examiner* — Eric K Ashbahian
(74) *Attorney, Agent, or Firm* — Benesch Friedlander Coplan & Aronoff LLP

(57) ABSTRACT

The present invention provides an organic light-emitting diode (OLED) pixel structure, including: a plurality of pixel groups having predetermined shapes that constitute a pixel layer, one of the pixel groups having predetermined shapes including at least two pixels of R, G, and B pixels and no common sub-pixel, each of the pixels including three sub-pixels having different areas, and areas of same sub-pixels in different pixels in one of the pixel groups having predetermined shapes are equal.

9 Claims, 6 Drawing Sheets

ORGANIC LIGHT-EMITTING DIODE PIXEL STRUCTURE AND DISPLAY DEVICE

CROSS REFERENCE TO RELATED APPLICATION

This application claims the priority of International Application No. PCT/CN2019/082840, filed on 2019 Apr. 16, which claims priority to Chinese Application No. 201910104792.X filed on 2019 Feb. 1. The entire disclosures of each of the above applications are incorporated herein by reference.

BACKGROUND OF INVENTION

Field of Invention

The present invention relates to the field of display, and in particular, to an organic light-emitting diode (OLED) pixel structure and a display device.

Description of Prior Art

The existing pixel arrangement has obvious disadvantages, such as jagged edge burrs, and picture distortion, etc. Especially for a higher resolution screen display, the sharpness is greatly reduced, and the small font cannot be clearly displayed. Moreover, since a pixel unit only has two sub-pixels, the dot pitch between the adjacent sub-pixels is small. Thus, it is more difficult to fabricate a fine metal mask (FMM), incurring difficulty in the evaporation process.

In summary, the existing pixel arrangement of an organic light-emitting diode (OLED) has technical problems of a small dot pitch between the adjacent sub-pixels, difficulty in fabrication of the fine metal mask, and difficulty in evaporation process.

SUMMARY OF INVENTION

The present invention provides an OLED pixel structure, which solves the technical problems of a small dot pitch between the adjacent sub-pixels, difficulty in fabrication of the fine metal mask, and difficulty in evaporation process.

To solve the above problems, the technical solution provided by the present invention is as follows:

An organic light-emitting diode (OLED) pixel structure is provided, which includes: a plurality of pixel groups having predetermined shapes that constitute a pixel layer, the pixel groups having predetermined shapes each having a rectangular shape, one of the pixel groups having predetermined shapes including at least two pixels, each of the at least two pixels including first sub-pixels, second sub-pixels, and third sub-pixels, wherein the first sub-pixels, the second sub-pixels, and the third sub-pixels each are configured to illuminate one of different colors which include red, green, or blue; and wherein areas of the first, second, and third sub-pixels in one of the pixels are not equal, while areas of same sub-pixels in different pixels in one of the pixel groups having predetermined shapes are equal.

In the OLED pixel structure provided by the embodiment of the present invention, the first sub-pixels are distributed at a center of one of the pixel groups having predetermined shapes, the third sub-pixels are distributed at an edge of one of the pixel groups having predetermined shapes, and the second sub-pixels are distributed below acute angles of adjacent two of the third sub-pixels; wherein in one of the pixels, a bottom edge of each of the first sub-pixels and a bottom edge of each of the second sub-pixels are disposed in parallel, and the first sub-pixels, the second sub-pixels, and the third sub-pixels all have isosceles triangle shapes; and wherein the sub-pixels disposed at corners of each of the pixel groups having predetermined shapes are the same sub-pixels and each have an isosceles triangle shape.

In the OLED pixel structure provided by the embodiment of the present invention, the third sub-pixels are isosceles triangles distributed at an edge of one of the pixel groups having predetermined shapes, the second sub-pixels are isosceles triangles distributed below the acute angles of adjacent two of the third sub-pixels, and the first sub-pixels are right-angled trapezoids distributed at a center of one of the pixel groups having predetermined shapes.

In the OLED pixel structure provided by the embodiment of the present invention, the first sub-pixels, the second sub-pixels, and the third sub-pixels are fabricated by different masks.

In the OLED pixel structure provided by the embodiment of the present invention, the first sub-pixels and the second sub-pixels have apex angles toward a center of one of the pixel groups having predetermined shapes; while the third sub-pixels have apex angles toward an outside of one of the pixel groups having predetermined shapes and distributed at four corners of one of the pixel groups having predetermined shapes.

In the OLED pixel structure provided by the embodiment of the present invention, the first sub-pixels, the second sub-pixels, and the third sub-pixels are all isosceles triangles.

In the OLED pixel structure provided by the embodiment of the present invention, an organic layer is filled between the first sub-pixels, the second sub-pixels, and the third sub-pixels, and the organic layer is made of a material including polyamide or acrylic.

In the OLED pixel structure provided by the embodiment of the present invention, the first sub-pixels, the second sub-pixels, and the third sub-pixels each are configured to illuminate one of different colors which include red, green, or blue.

In the OLED pixel structure provided by the embodiment of the present invention, the pixel groups having predetermined shapes have rectangular shapes.

The invention also provides an OLED pixel structure, including: a plurality of pixel groups having predetermined shapes that constitute a pixel layer, the pixel groups having predetermined shapes having rectangle shapes, each pixel groups having predetermined shapes including at least two pixels, each of the at least two pixels including first sub-pixels, second sub-pixels, and third sub-pixels, wherein areas of the first, second, and third sub-pixels in one of the pixels are not equal, while areas of same sub-pixels in different pixels in one of the pixel groups having predetermined shapes are equal.

In the OLED pixel structure provided by the embodiment of the present invention, the first sub-pixels are distributed at a center of one of the pixel groups having predetermined shapes, the third sub-pixels are distributed at an edge of one of the pixel groups having predetermined shapes, and the second sub-pixels are distributed below acute angles of adjacent two of the third sub-pixels; wherein in one of the pixels, a bottom edge of each of the first sub-pixels and a bottom edge of each of the second sub-pixels are disposed in parallel, and the first sub-pixels, the second sub-pixels, and the third sub-pixels all have isosceles triangle shapes; and wherein the sub-pixels disposed at corners of each of the pixel groups having predetermined shapes are the same sub-pixels and each have an isosceles triangle shape.

In the OLED pixel structure provided by the embodiment of the present invention, the third sub-pixels are isosceles triangles distributed at an edge of one of the pixel groups having predetermined shapes, the second sub-pixels are isosceles triangles distributed below the acute angles of adjacent two of the third sub-pixels, and the first sub-pixels are right-angled trapezoids distributed at the center of one of the pixel groups having predetermined shapes.

In the OLED pixel structure provided by the embodiment of the present invention, the first sub-pixels, the second sub-pixels, and the third sub-pixels are fabricated by different masks.

In the OLED pixel structure provided by the embodiment of the present invention, the first sub-pixels and the second sub-pixels have apex angles toward a center of one of the pixel groups having predetermined shapes; while the third sub-pixels have apex angles toward an outside of one of the pixel groups having predetermined shapes and distributed at four corners of one of the pixel groups having predetermined shapes.

In the OLED pixel structure provided by the embodiment of the present invention, an organic layer is filled between the first sub-pixels, the second sub-pixels, and the third sub-pixels, and the organic layer is made of a material including polyamide or acrylic.

The present invention also provides a display device, including an OLED pixel structure, including: an organic light-emitting diode (OLED) pixel structure, including: a plurality of pixel groups having predetermined shapes that constitute a pixel layer, the pixel groups having predetermined shapes each having a rectangular shape, each pixel groups having predetermined shapes including at least two pixels, each of the at least two pixels including first sub-pixels, second sub-pixels, and third sub-pixels, wherein areas of the first, second, and third sub-pixels in one of the pixels are not equal, while areas of same sub-pixels in different pixels in one of the pixel groups having predetermined shapes are equal.

The beneficial effects of the present invention are that an organic light-emitting diode (OLED) pixel structure includes pixel groups which include at least two pixels, each of the at least two pixels including first sub-pixels, second sub-pixels, and third sub-pixels.

Areas of the first, second, and third sub-pixels in one of the pixels are not equal, while areas of same sub-pixels in different pixels in one of the pixel groups having predetermined shapes are equal. The OLED pixel structure proposed in the present invention can have more pixel units in a given light-emitting area. Therefore, a higher resolution is ensured, and meanwhile, the fabrication difficulty of a fine mask is reduced compared to the existing pixel arrangement, and thus it is more conducive to actual fabrication.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

The following description of the various embodiments is provided to illustrate the specific embodiments of the invention. The spatially relative directional terms mentioned in the present invention, such as "upper", "lower", "before", "after", "left", "right", "inside", "outside", "side", etc. and the like, may be used herein for ease of description to describe one element or feature's relationship to another element(s) or feature(s) as illustrated in the figures which are merely references. The spatially relative terms are intended to encompass different orientations in addition to the orientation as depicted in the figures.

An embodiment of the present invention can solve the technical problems of a small dot pitch between the adjacent sub-pixels, difficulty in fabrication of the fine metal mask, and difficulty in evaporation process.

Figure 1:
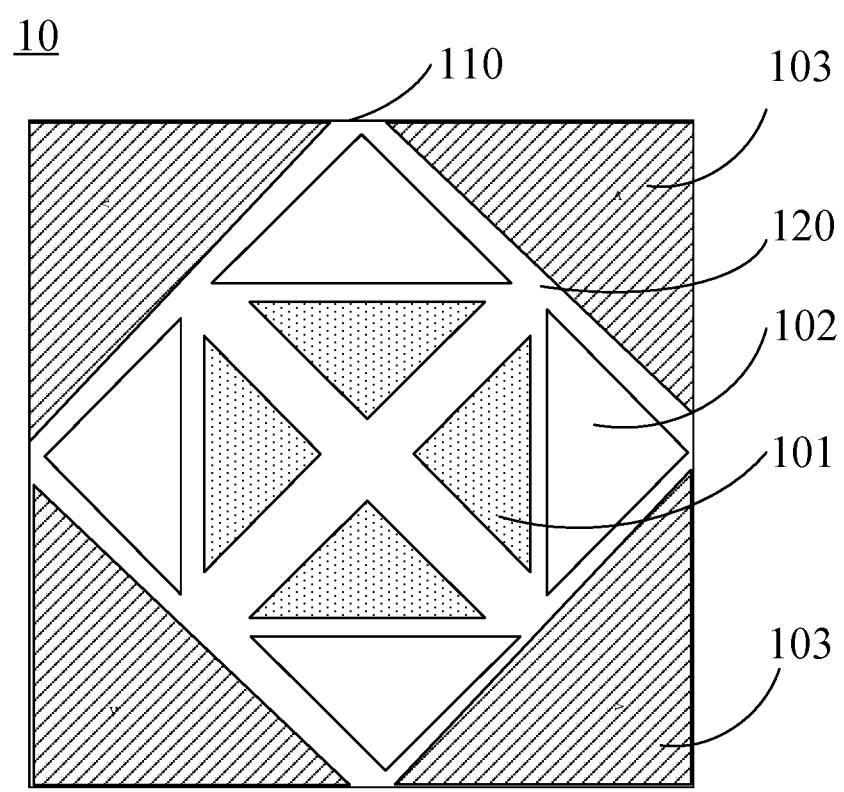
FIG. 1 is a first schematic diagram of a first OLED pixel structure according to an embodiment of the present invention.

As shown in FIG. 1, a first OLED pixel structure 10 provided by the present invention includes a plurality of pixel groups 110 having predetermined shapes that constitute a pixel layer, one of the pixel groups 110 having predetermined shapes including at least two pixels. In FIG. 1, one of the pixel groups 110 having predetermined shapes includes four pixels, and each of the pixels includes first sub-pixels 101, second sub-pixels 102, and third sub-pixels 103.

Further, the first sub-pixels 101 are distributed at a center of one of the pixel groups 110 having predetermined shapes; the second sub-pixels 102 are distributed below acute angles of adjacent two of the third sub-pixels 103; and the third sub-pixels are distributed at four corners of one of the pixel groups 110 having predetermined shapes.

In a pixel, a bottom edge of the first sub-pixels 101 and a bottom edge of the second sub-pixels 102 are disposed in parallel, and the first sub-pixels 101, the second sub-pixels 102, and the third sub-pixels 103 are all isosceles triangles.

Organic layers 120 are fabricated and filled between the first sub-pixels 101, the second sub-pixels 102, and the third sub-pixels 103 respectively by using three different metal masks.

In this embodiment, the pixel groups 110 having predetermined shapes have rectangular shapes, that is, the OLED pixel structure 10 in this embodiment includes a plurality of pixel groups 110 having predetermined shapes that constitute a pixel layer. The pixel groups 110 having predetermined shapes include four pixels, and each of the four pixels includes the first sub-pixels 101, the second sub-pixels 102, and the third sub-pixels 103, respectively.

Further, the first sub-pixels 101 are distributed at a center of the pixel groups having predetermined shapes 110; the third sub-pixels 103 are distributed at four corners of one of the pixel groups 110 having predetermined shapes, and the second sub-pixels 102 are distributed below the acute angles of adjacent two of the third sub-pixels 103.

In a pixel, a bottom edge of the first sub-pixels 101 and a bottom edge of the second sub-pixels 102 are disposed in parallel, and the first sub-pixels 101, the second sub-pixels 102, and the third sub-pixels 103 are all isosceles triangles. The organic layers 120 are fabricated and filled between the first sub-pixels 101, the second sub-pixels 102, and the third sub-pixels 103 respectively by using three different metal masks.

The OLED pixel structure provided in this embodiment is different from the conventional pixel arrangement, which can have more pixel units in a given light-emitting area. Therefore, a higher resolution is ensured, and meanwhile, a fabrication difficulty of a fine mask is reduced compared to the existing pixel arrangement, and thus it is more conducive to actual fabrication.

Figure 2:
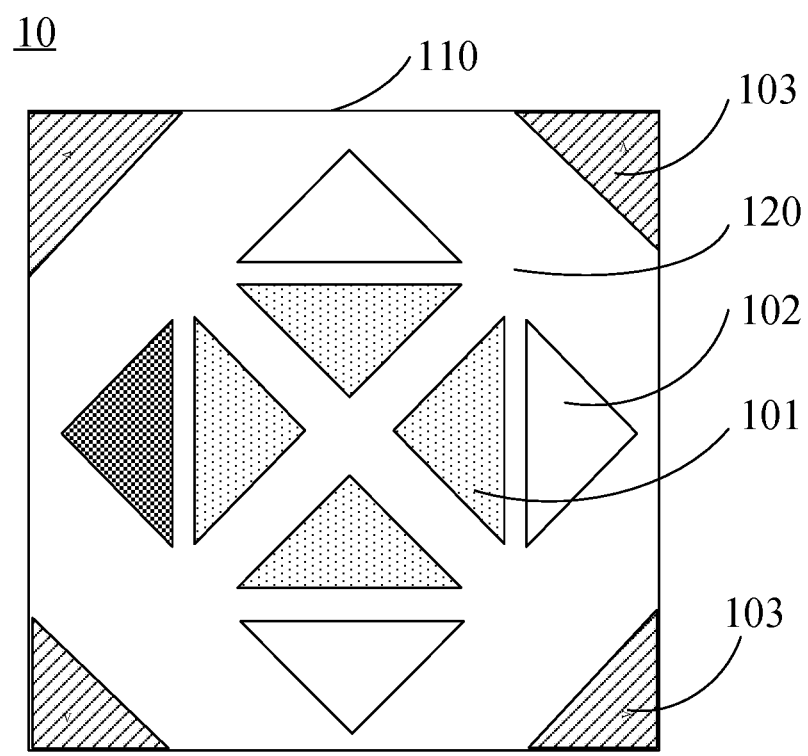
FIG. 2 is a second schematic diagram of a first OLED pixel structure according to an embodiment of the present invention.

In an embodiment, as shown in FIG. 2, the first sub-pixels 101, the second sub-pixels 102, and the third sub-pixels 103 are fabricated using a same metal mask.

In an embodiment, as shown in FIG. 2, the first sub-pixels 101, the second sub-pixels 102, and the third sub-pixels 103 each are configured to illuminate one of different colors which include red, green, or blue.

Figure 3:
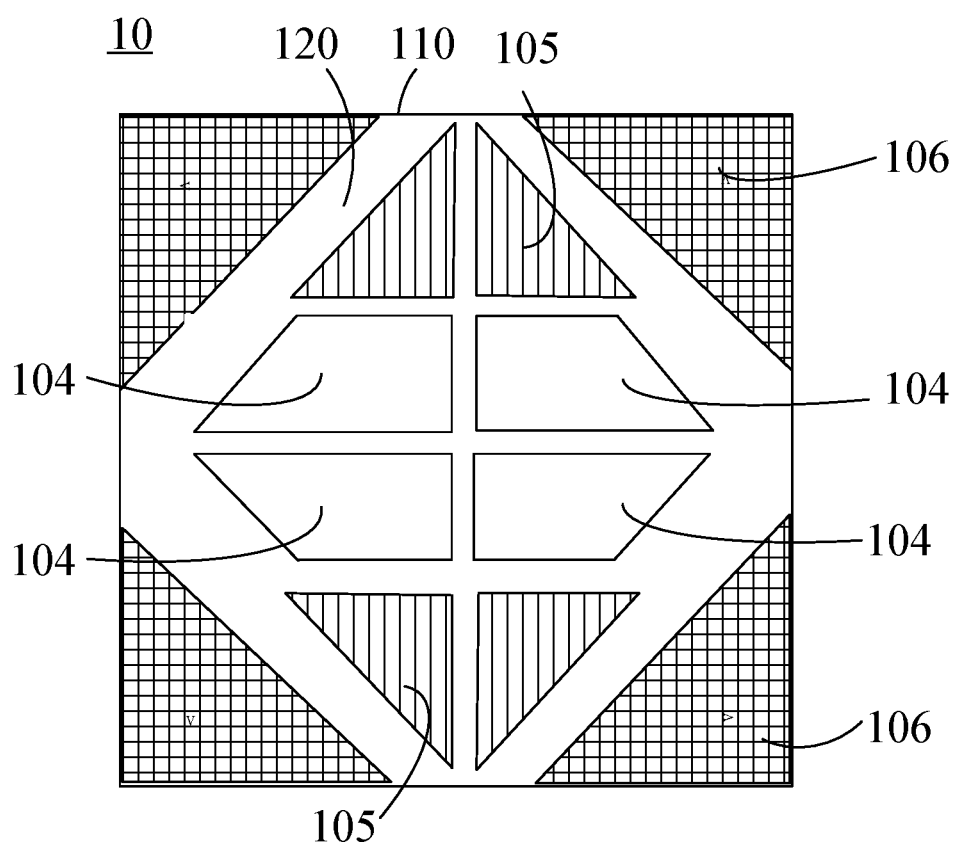
FIG. 3 is a first schematic diagram of a second OLED pixel structure according to an embodiment of the present disclosure.

As shown in FIG. 3, the second OLED pixel structure 10 provided by the present invention includes a plurality of pixel groups 110 having predetermined shapes that constitute a pixel layer, the predetermined shapes are squares, and the pixel groups 110 having predetermined shapes include four pixels, each of the four pixels includes first sub-pixels 104, second sub-pixels 105, and third sub-pixels 106, wherein the third sub-pixels 106 are isosceles triangles distributed at four corners of the pixel groups 110 having predetermined shapes.

Further, the first sub-pixels 104 are right-angled trapezoids, distributed at a center of one of the pixel groups 110 having predetermined shapes; the second sub-pixels 105 are isosceles triangles distributed below acute angles of adjacent two of the third sub-pixels 106. The organic layers 120 are fabricated and filled between the first sub-pixels 104, the second sub-pixels 105, and the third sub-pixels 106 respectively by using three different metal masks.

In this embodiment, the OLED pixel structure 10 includes a plurality of pixel groups having predetermined shapes 110 constituting a pixel layer, and the pixel groups having predetermined shapes 110 includes four pixels. Each of the four pixels include first sub-pixels 104, the second sub-pixels 105 and the third sub-pixels 106, which are all isosceles triangles, and are distributed at the four corners of the pixel groups having predetermined shapes 110.

Further, the first sub-pixels 104 are right-angled trapezoids, distributed at the center of the pixel groups 110 having predetermined shapes; and the second sub-pixels 105 are isosceles triangles, distributed below acute angles of adjacent two of the third sub-pixels 106.

In this embodiment, the organic layers 120 are fabricated and filled between the first sub-pixels 104, the second sub-pixels 105, and the third sub-pixels 106 respectively by using three different metal masks. This pixel structure 10 is different from the existing pixel structure, which can have more pixel units in a given light-emitting area. Therefore, a higher resolution is ensured, and meanwhile, a fabrication difficulty of a fine mask is reduced compared to the existing pixel arrangement, and thus it is more conducive to actual fabrication.

Figure 4:
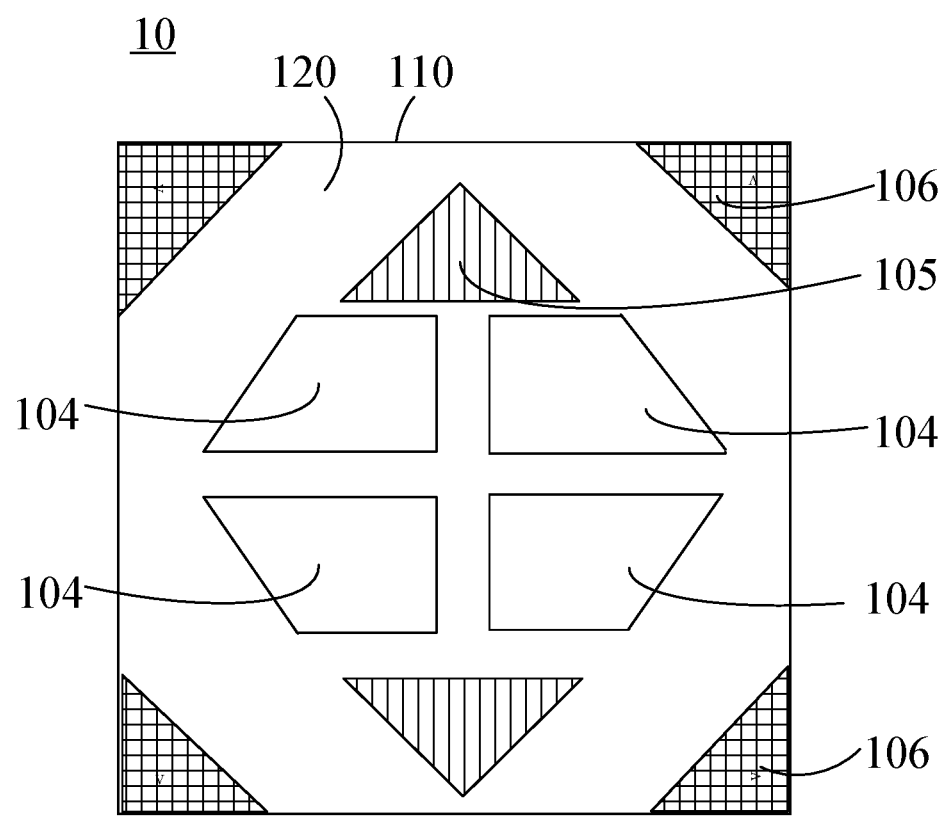
FIG. 4 is a second schematic diagram of a second OLED pixel structure according to an embodiment of the present disclosure.

In an embodiment, as shown in FIG. 4, the second sub-pixels 105 and the third sub-pixels 106 are fabricated using a same metal mask.

In an embodiment, as shown in FIG. 3, the first sub-pixels 104, the second sub-pixels 105, and the third sub-pixels 106 each are configured to illuminate one of different colors which include red, green, or blue.

Figure 5:
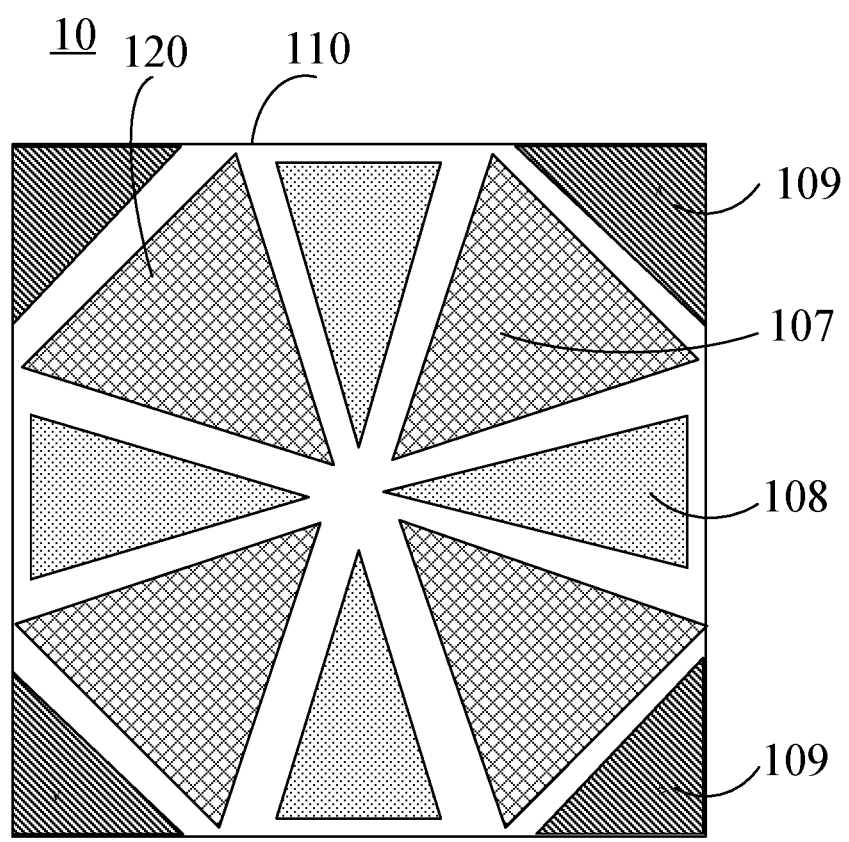
FIG. 5 is a first schematic diagram of a third OLED pixel structure according to an embodiment of the present invention.

As shown in FIG. 5, the third OLED pixel structure 10 provided by the present invention includes a plurality of pixel groups 110 having predetermined shapes that constitute a pixel layer, and the pixel groups 110 having predetermined shapes 110 include four pixels. Each of the four pixels include first sub-pixels 107, second sub-pixels 108, and third sub-pixels 109.

Further, the first sub-pixels 107, the second sub-pixels 108, and the third sub-pixels 109 are all isosceles triangles, and the third sub-pixels 109 have apex angles toward an outside of one of the pixel groups 110 having predetermined shapes and distributed at four corners of one of the pixel groups 110 having predetermined shapes, while the first sub-pixels 107 and the second sub-pixels 108 have apex angles toward a center of one of the pixel groups 110 having predetermined shapes.

The organic layers 120 are fabricated and filled between the first sub-pixels 107, the second sub-pixels 108, and the third sub-pixels 109 respectively by using three different metal masks.

In this embodiment, the OLED pixel structure 10 includes a plurality of pixel groups 110 having predetermined shapes constituting a pixel layer, and the pixel groups 110 having predetermined shapes include four pixels. Each of the four pixels includes the first sub-pixels 107, the second sub-pixels 108, and the third sub-pixels 109, wherein the first sub-pixels 107, the second sub-pixels 108, and the third sub-pixels 109 are all isosceles triangles. The third sub-pixels 109 have apex angles toward an outside of one of the pixel groups 110 having predetermined shapes and distributed at four corners of one of the pixel groups 110 having predetermined shapes, while the first sub-pixels 107 and the second sub-pixels 108 have apex angles toward a center of one of the pixel groups 110 having predetermined shapes. The organic layers 120 are fabricated and filled between the first sub-pixels 107, the second sub-pixels 108, and the third sub-pixels 109 respectively by using three different metal masks. This pixel structure is different from the existing pixel structure, which can have more pixel units in a given light-emitting area. Therefore, a higher resolution is ensured, and meanwhile, a fabrication difficulty of a fine mask is reduced compared to the existing pixel arrangement, and thus it is more conducive to actual fabrication.

Figure 6:
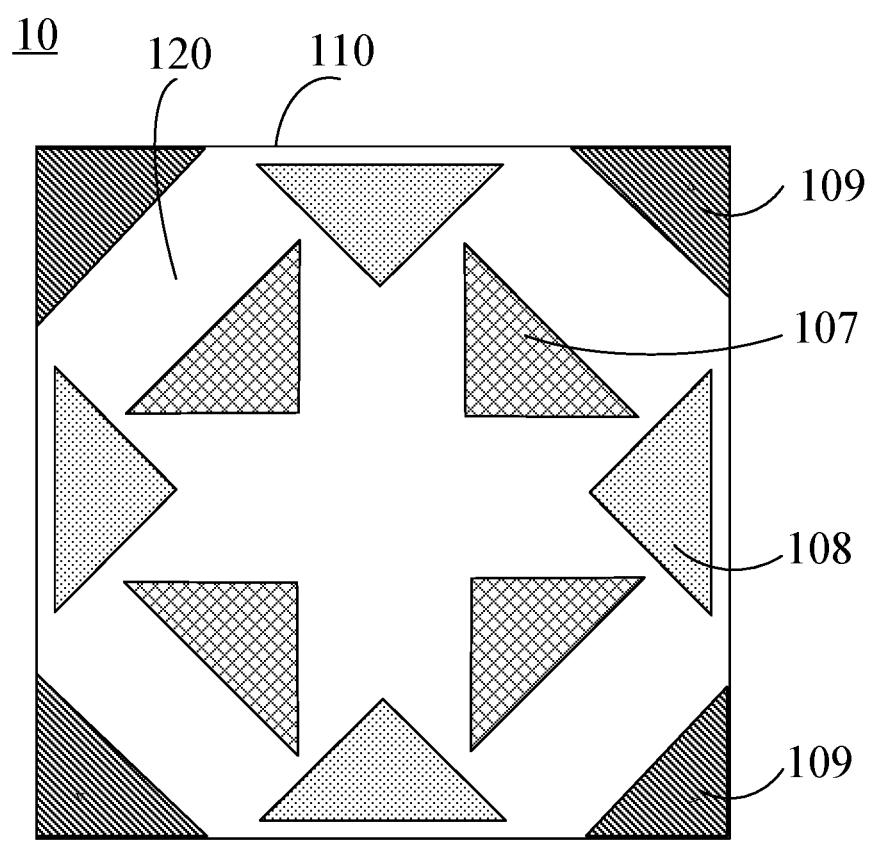
FIG. 6 is a second schematic diagram of a third OLED pixel structure according to an embodiment of the present invention.

In one embodiment, as shown in FIG. 6, the first sub-pixels 107, the second sub-pixels 108, and the third sub-pixels 109 are fabricated using a same metal mask.

In an embodiment, as shown in FIG. 5, the first sub-pixels 107, the second sub-pixels 108, and the third sub-pixels 109 are configured with different illuminating colors, and the illuminating colors of any one of red, green, or blue.

In an embodiment, the organic layer 120 is made of polyamide (PA) or acrylic.

According to the foregoing embodiments, the present invention provides an OLED pixel structure, including a plurality of pixel groups having predetermined shapes that constitute a pixel layer, the pixel groups having predetermined shapes having rectangle shapes, the pixel groups having predetermined shapes including at least two pixels, each of the at least two pixels including first sub-pixels, second sub-pixels, and third sub-pixels, wherein areas of the first, second, and third sub-pixels in one of the pixels are not equal, while areas of same sub-pixels in different pixels in one of the pixel groups having predetermined shapes are equal.

The present invention proposes various OLED pixel structures to assure a higher resolution, and a fabrication difficulty of a fine mask is reduced compared to the existing pixel arrangement, and thus it is more conducive to actual fabrication.

While the present invention has been described by way of example and in terms of the preferred embodiments, it is to be understood that the present invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. An organic light-emitting diode (OLED) pixel structure, comprising: a plurality of pixel groups having predetermined shapes that constitute a pixel layer, the pixel groups having predetermined shapes each having a rectangular shape, each predetermined shaped pixel group comprising at least two pixels, each of the at least two pixels comprising first sub-pixels, second sub-pixels, and third sub-pixels, wherein the first sub-pixels, the second sub-pixels, and the third sub-pixels each are configured to illuminate one of different colors which include red, green, or blue;
   wherein areas of the first, second, and third sub-pixels in one of the pixels are not equal, while areas of same sub-pixels in different pixels in one of the pixel groups having predetermined shapes are equal;
   wherein the first sub-pixels are distributed at a center of one of the pixel groups having predetermined shapes, the third sub-pixels are distributed at an edge of one of the pixel groups having predetermined shapes, and the second sub-pixels are distributed below acute angles of adjacent two of the third sub-pixels;
   wherein in one of the pixels, a bottom edge of each of the first sub-pixels and a bottom edge of each of the second sub-pixels are disposed in parallel, and the first sub-pixels, the second sub-pixels, and the third sub-pixels all have isosceles triangle shapes; and
   wherein the sub-pixels disposed at corners of each of the pixel groups having predetermined shapes are the same sub-pixels and each have an isosceles triangle shape.

2. The OLED pixel structure according to claim 1, wherein the first sub-pixels, the second sub-pixels, and the third sub-pixels are fabricated by different masks.

3. The OLED pixel structure according to claim 1, wherein an organic layer is filled between the first sub-pixels, the second sub-pixels, and the third sub-pixels, and the organic layer is made of a material comprising polyamide or acrylic.

4. An organic light-emitting diode (OLED) pixel structure, comprising: a plurality of pixel groups having predetermined shapes that constitute a pixel layer, the pixel groups having predetermined shapes having rectangle shapes, each pixel groups having predetermined shapes comprising at least two pixels, each of the at least two pixels comprising first sub-pixels, second sub-pixels, and third sub-pixels,
   wherein areas of the first, second, and third sub-pixels in one of the pixels are not equal, while areas of same sub-pixels in different pixels in one of the pixel groups having predetermined shapes are equal;
   wherein the first sub-pixels are distributed at a center of one of the pixel groups having predetermined shapes, the third sub-pixels are distributed at an edge of one of the pixel groups having predetermined shapes, and the second sub-pixels are distributed below acute angles of adjacent two of the third sub-pixels;
   wherein in one of the pixels, a bottom edge of each of the first sub-pixels and a bottom edge of each of the second sub-pixels are disposed in parallel, and the first sub-pixels, the second sub-pixels, and the third sub-pixels all have isosceles triangle shapes; and
   wherein the same sub-pixels are disposed corresponding to corners of the pixel groups having predetermined shapes, and the same sub-pixels have isosceles triangle shapes.

5. The OLED pixel structure according to claim 4, wherein the first sub-pixels, the second sub-pixels, and the third sub-pixels are fabricated by different masks.

6. The OLED pixel structure according to claim 4, wherein an organic layer is filled between the first sub-pixels, the second sub-pixels, and the third sub-pixels, and the organic layer is made of a material comprising polyamide or acrylic.

7. The OLED pixel structure according to claim 4, wherein the first sub-pixels, the second sub-pixels and the third sub-pixels each are configured to illuminate one of different colors which include red, green, or blue.

8. A display device, comprising: the organic light-emitting diode (OLED) pixel structure according to claim 4.

9. An organic light-emitting diode (OLED) pixel structure, comprising: a plurality of pixel groups having predetermined shapes that constitute a pixel layer, the pixel groups having predetermined shapes each having a rectangular shape, each predetermined shaped pixel group comprising at least two pixels, each of the at least two pixels comprising first sub-pixels, second sub-pixels, and third sub-pixels, wherein the first sub-pixels, the second sub-pixels, and the third sub-pixels each are configured to illuminate one of different colors which include red, green, or blue;
   wherein areas of the first, second, and third sub-pixels in one of the pixels are not equal, while areas of same sub-pixels in different pixels in one of the pixel groups having predetermined shapes are equal; and
   wherein the third sub-pixels are isosceles triangles distributed at an edge of one of the pixel groups having predetermined shapes, the second sub-pixels are isosceles triangles distributed below the acute angles of adjacent two of the third sub-pixels, and the first sub-pixels are right-angled trapezoids distributed at a center of one of the pixel groups having predetermined shapes.

* * * * *